(12) United States Patent
Hung et al.

(10) Patent No.: US 11,395,440 B2
(45) Date of Patent: Jul. 19, 2022

(54) HEAT SINK MODULE AND MANUFACTURING METHOD THEREOF

(71) Applicant: Delta Electronics, Inc., Taoyuan (TW)

(72) Inventors: Chun-Yang Hung, Taoyuan (TW); Li-Kuang Tan, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 61 days.

(21) Appl. No.: 17/013,569

(22) Filed: Sep. 5, 2020

(65) Prior Publication Data

US 2020/0404807 A1 Dec. 24, 2020

Related U.S. Application Data

(60) Continuation-in-part of application No. 15/974,894, filed on May 9, 2018, now abandoned, which is a division of application No. 15/336,467, filed on Oct. 27, 2016, now abandoned.

(30) Foreign Application Priority Data

Aug. 19, 2016 (CN) .......................... 201610694179.4

(51) Int. Cl.
    *F28F 3/02* (2006.01)
    *H05K 7/20* (2006.01)
    *H01L 23/36* (2006.01)
    *H01L 23/367* (2006.01)
    *B22D 19/00* (2006.01)

(52) U.S. Cl.
    CPC ..... *H05K 7/20409* (2013.01); *B22D 19/0063* (2013.01); *F28F 3/02* (2013.01); *H01L 23/36* (2013.01); *H01L 23/3675* (2013.01); *H05K 7/20509* (2013.01); *F28F 2275/14* (2013.01)

(58) Field of Classification Search
    CPC .... B22D 17/00; B22D 19/0063; B22D 19/04; H01L 21/4871; H01L 23/367; H01L 23/3672; H01L 23/36; H01L 23/3675; H05K 7/20509; H05K 7/20409; F28F 3/02; F28F 2275/14
    See application file for complete search history.

(56) References Cited

U.S. PATENT DOCUMENTS 7,003,970 B2 * 2/2006 Iida .................. H05K 1/141
                                                257/E23.102
2015/0360332 A1 * 12/2015 Singh ................. F28D 1/024
                                                       72/256

* cited by examiner

*Primary Examiner* — Moshe Wilensky
(74) *Attorney, Agent, or Firm* — Chun-Ming Shih; HDLS IPR Services (57) ABSTRACT

In a heat sink module and a manufacturing method thereof, the method includes steps of: forming a heat dissipation fin set by aluminum extrusion process, wherein the heat dissipation fin set includes a plate, a plurality of fins extending from one side of the plate and being arranged spaced apart from one another, and a joint portion formed on the other side of the plate; placing the plate in a mold; injecting molten metal into the mold; forming a base by die-casting of the molten metal. The plate and the joint portion are wrapped by the base. The joint portion forms a connection structure including a bump and a notch fitted with the bump, so as to connect and fix the base and the heat dissipation fin set. The heat sink module has the strengthened connection structure and the fins with a superior aspect ratio.

6 Claims, 12 Drawing Sheets

HEAT SINK MODULE AND MANUFACTURING METHOD THEREOF

CROSS-REFERENCE TO RELATED APPLICATION

This application is a continuing-in part application of U.S. patent application Ser. No. 15/974,894 filed on May 9, 2018, which is a divisional application of U.S. patent application Ser. No. 15/336,467, filed on Oct. 27, 2016, and entitled "HEAT SINK MODULE AND MANUFACTURING METHOD THEREOF". The entire disclosures of the above application are all incorporated herein by reference.

TECHNICAL FIELD

The present invention relates to a heat sink module and a manufacturing method thereof and, in particular, to a heat sink module having a strengthened connection structure and aligned fins with a superior aspect ratio.

BACKGROUND

When electronic products are in operation, undesired heat is generated due to impedance. If the heat is not expelled effectively and is accumulated inside the electronic products, the electronic products may malfunction or may be damaged due to increased temperature. Therefore, efficiency of a heat sink device is important for stable operations of the electronic product.

A conventional flat-plate type heat dissipation fin or a conventional column-type heat sink fin is made by a die-casting process and is integrally formed with a base. Since there is a mold release requirement in the die-casting process, the flat-plate type heat dissipation fin and the column-type heat dissipation fin both need a draft angle of 2 to 5 degrees. Consequently, an overall weight is heavy and an aspect ratio is usually less than 10. As a result, a fin is too thick, and fewer fins can be installed in the heat sink devices of the same size, which causes an insufficient heat dissipation area and inferior heat dissipation efficiency.

Accordingly, it is the aim of the present invention to solve the above-mentioned problems, on the basis of which the present invention is accomplished.

SUMMARY

The present invention is directed to provide a heat sink module and a manufacturing method thereof. A heat dissipation fin set having a connection structure is formed by an aluminum extrusion process. Different parts of the heat sink module are made by die-casting, thereby having high connection strength. Moreover, the heat dissipation fin set, having aligned fins with an aspect ratio of 10 or above, can be produced, and therefore a heat dissipation area is increased.

Accordingly, the present invention provides a heat sink module, comprising a base, a heat dissipation fin set, and a connection structure. The heat dissipation fin set includes a plate and a plurality of fins. Each of the fins extends from one side of the plate to be away from the base and are arranged spaced apart from one another. The connection structure is disposed between the plate and the base for fixing the base and the heat dissipation fin set, wherein the connection structure includes at least one bump and at least one notch fitted with the bump.

According to one embodiment of the present invention, the bump is a trapezoidal block gradually widening as it protrudes from a surface of the plate toward the base, and the notch is a trapezoidal notch formed by denting a surface of the base.

According to one embodiment of the present invention, the bump is a trapezoidal block gradually widening as it protrudes from a surface of the base toward the plate, and the notch is a trapezoidal notch formed by denting a surface of the plate.

According to one embodiment of the present invention, the bump is a trapezoidal block gradually widening as it extends along at least one side of a peripheral edge of the plate, and the notch is a trapezoidal notch formed by denting a surface of the base.

According to one embodiment of the present invention, the bump has a connection depth; the connection depth is smaller than a plate thickness of the plate.

According to one embodiment of the present invention, an aspect ratio of the fin is from 10 to 20.

According to one embodiment of the present invention, the bump extends from one side of the peripheral edge of the plate to another side of the peripheral edge of the plate.

According to one embodiment of the present invention, the bump extends in a straight direction or in an oblique direction.

According to one embodiment of the present invention, the base and the heat dissipation fin set consist of the same or different metal materials.

Accordingly, the present invention further provides a manufacturing method of a heat sink module, comprising steps of: forming a heat dissipation fin set by an aluminum extrusion process, wherein the heat dissipation fin set comprises a plate, a plurality of fins extending from one side of the plate and being arranged spaced from one another, and a joint portion formed on the other side of the plate; placing the plate in a mold; injecting molten metal into the mold; and forming a base by die-casting of the molten metal, wherein the plate and the joint portion are wrapped by the base, wherein the joint portion forms a connection structure comprising a bump and a notch fitted with the bump, so as to connect and fix the base and the heat dissipation fin set.

Compared with conventional techniques, the present invention further has the following benefits. Unlike the conventional techniques, the present invention does not require a draft angle for forming the heat dissipation fin. The connection structures of the present invention have various designs to enhance the connection strength between the heat dissipation fin set and the base. The heat dissipation fin set can be produced at one time or one process, thus saving considerable time in producing fins by separate aluminum extrusion processes, and eliminating the possibility of having burrs caused by the overflow of the molten metal when the base is formed by die-casting process. In addition, if it is desired to further improve the heat conductive efficiency, the heat dissipation fin set and the base can be made of different metal materials.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
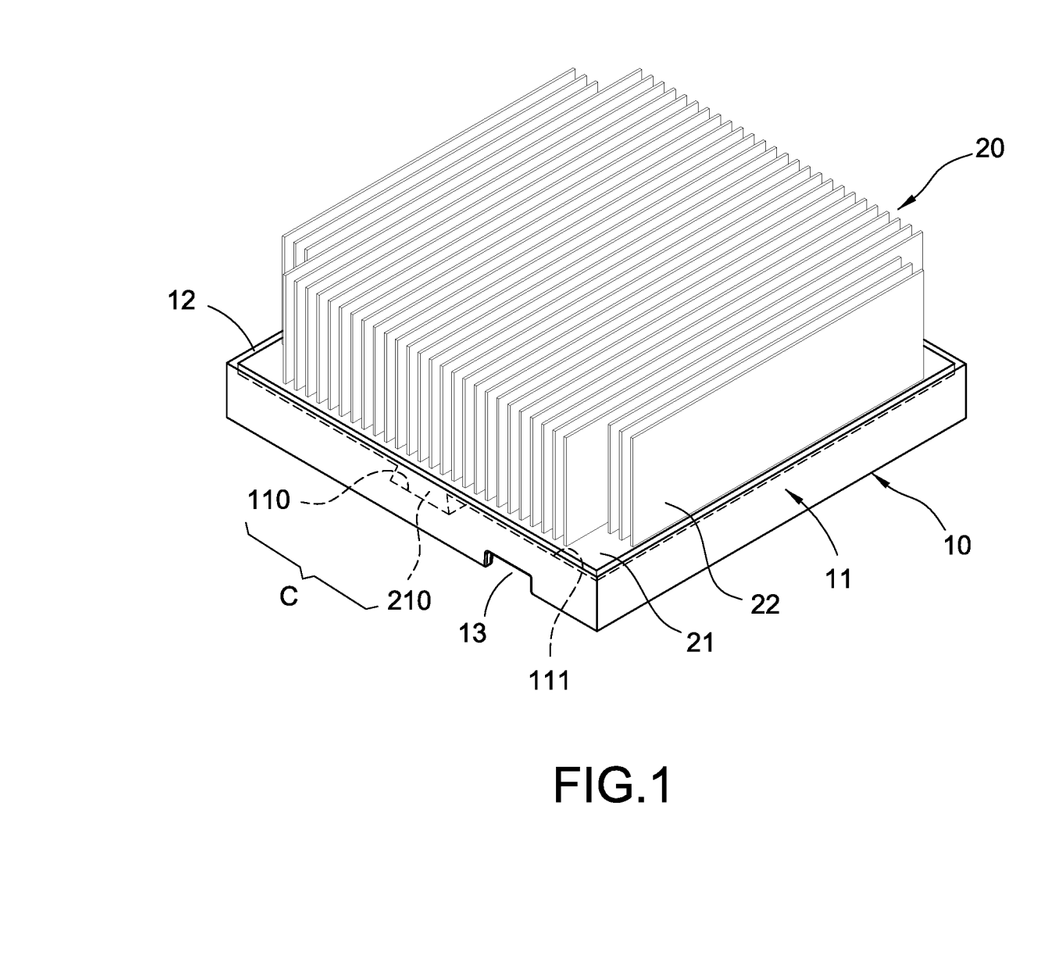
FIG. 1 is a perspective view of a heat sink module according to an embodiment of the present invention.
Figure 2:
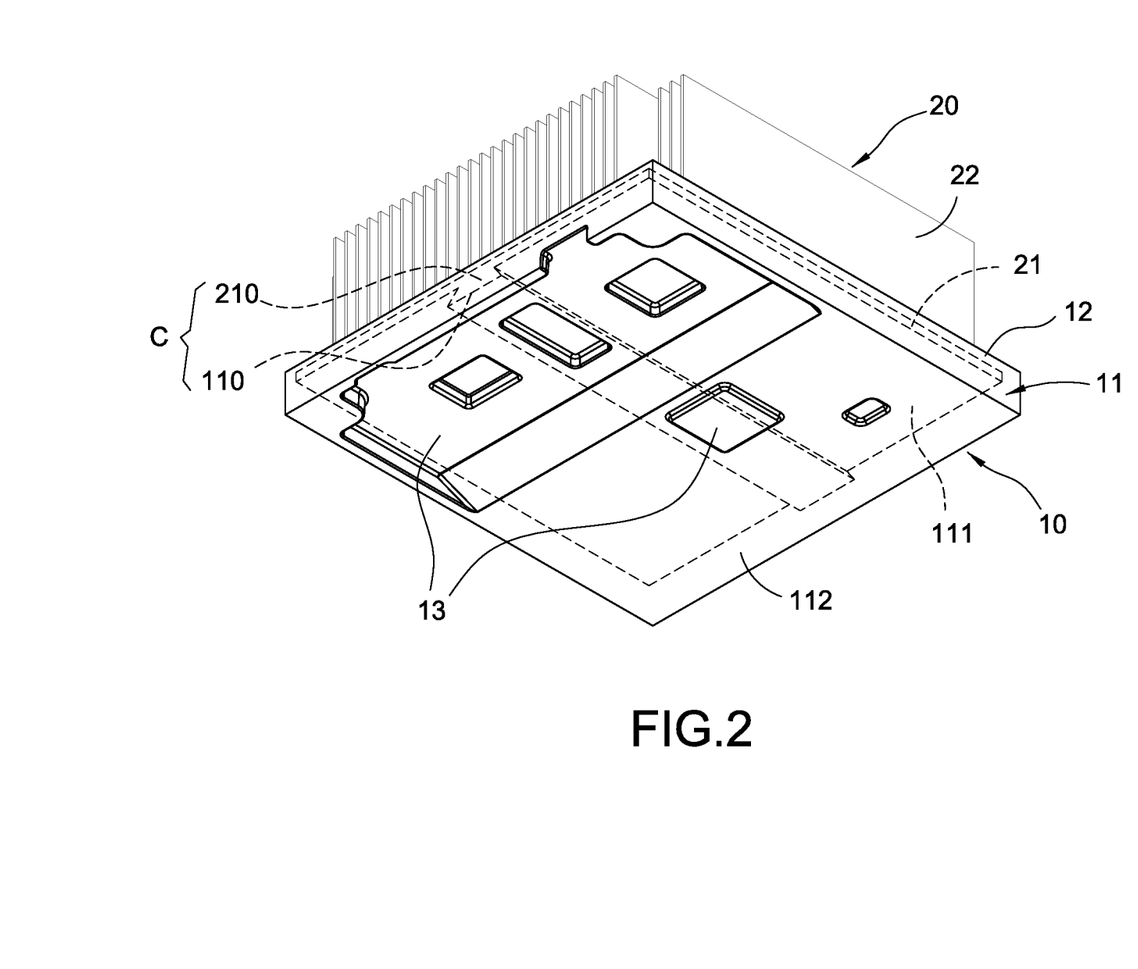
FIG. 2 is another perspective view of the heat sink module according to the embodiment of the present invention in FIG. 1.
Figure 7:
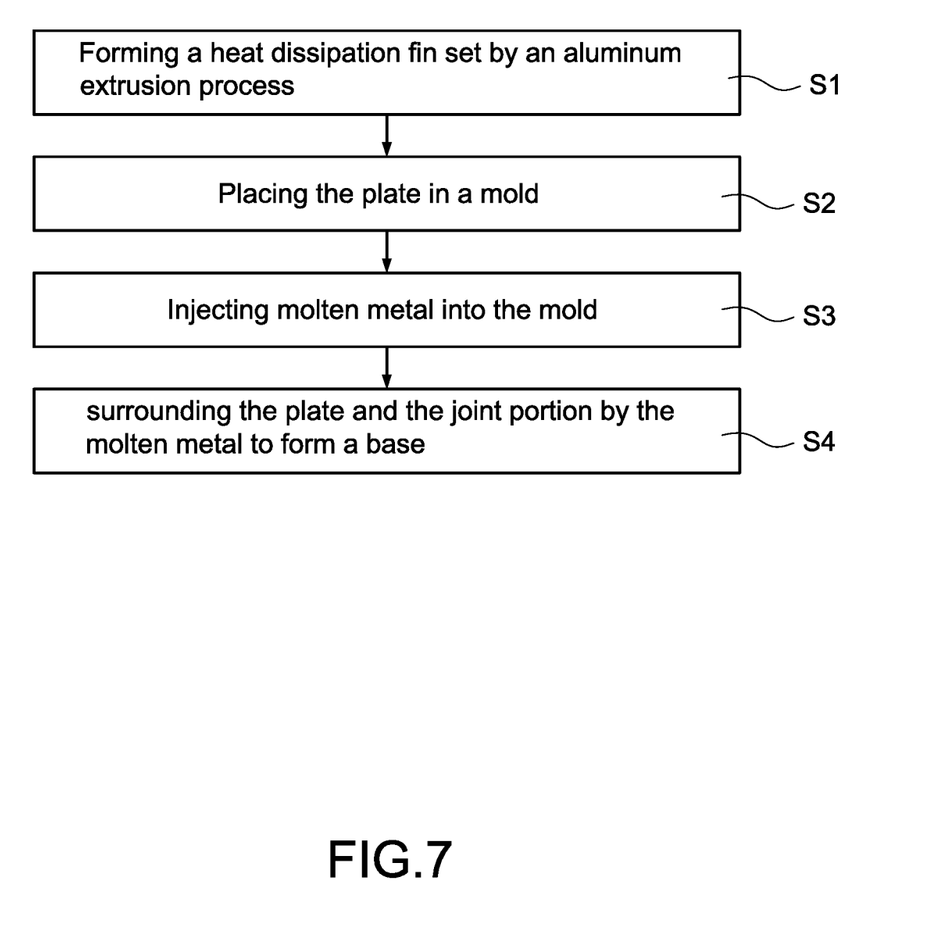
FIG. 7 is a process flow diagram illustrating a manufacturing method of the heat sink module of an embodiment of the present invention.

Referring to FIGS. 1 and 2 and FIG. 7, an embodiment of the present invention provides a heat sink module and a manufacturing method thereof. Various embodiments of the heat sink module can be more clearly understood and appreciated with reference to the following description regarding the manufacturing method.

In step S1, a heat dissipation fin set 20 is formed by an aluminum extrusion process. The heat dissipation fin set 20 includes a plate 21, a plurality of fins 22 extending from an external surface 201 at one side of the plate 21 and being arranged spaced from one another, and a joint portion 210 formed on an internal surface 202 at the other opposite side of the plate 21.

In step S2, the plate 21 and the joint portion 210 of the heat dissipation fin set 20 are placed in a mold 30.

In step S3, molten metal is injected into the mold 30.

In step S4, a base 10 is formed by die-casting of the molten metal. The base 10 wraps the plate 21 and the joint portion 210 to form a surrounding block portion 12. Corresponding to a shape of the joint portion 210 of the heat dissipation fin set 20, a connection structure C is formed. The connection structure C includes at least one bump and at least one notch fitted with the bump. The bump has a thickness gradient to thereby joint and fix together the base 10 and the heat dissipation fin set 20. The molten metal can consist of aluminum, copper or alloy thereof, and the present invention is not limited in this regard.

The die-casting process is further described according to FIGS. 8 to 11.

The step S2 has Steps S21 and S22. In Step S21 according to FIGS. 8 to 10, a mold 30 is provided, and the mold 30 has a fixed part 310 and a movable part 320. The fixed part 310 and the movable part 320 are closed with each other to enclose a molding cave 311 and an isolation cave 321 in the mold 30. The isolation cave 321 is communicated with the molding cave 311. The fixed part 310 and the movable part 320 are closed with each other, and the isolation cave 321 can be enclosed thereby. According to the present disclosure, the isolation cave 321 is preferably recessed from a surface of the movable part 320, and the molding cave 311 is preferably recessed from a surface of the fixed part 310

Figure 9:
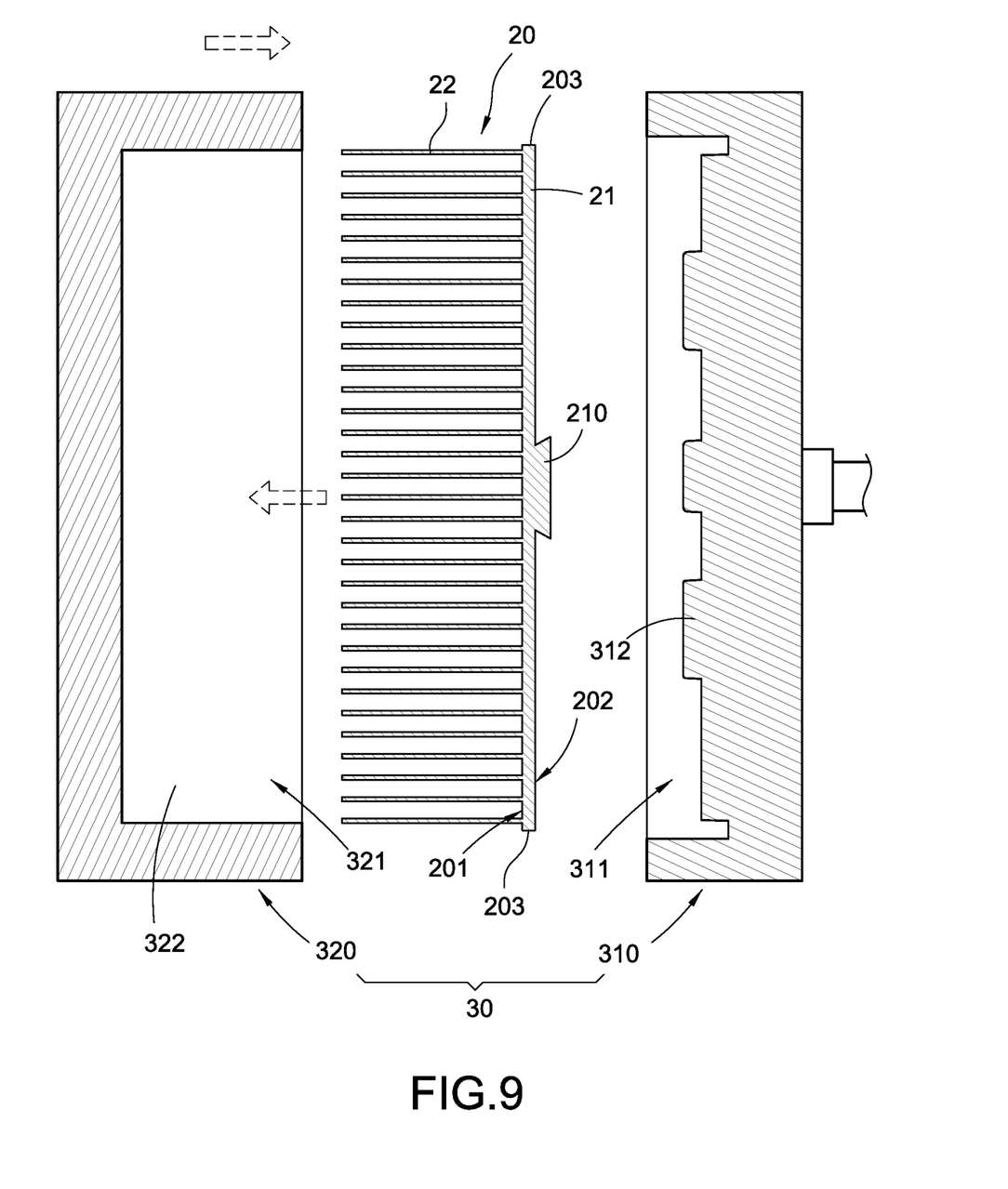
FIG. 9 is a top cross-sectional view illustrating a mold and the fin set of the die-casting process.
Figure 10:
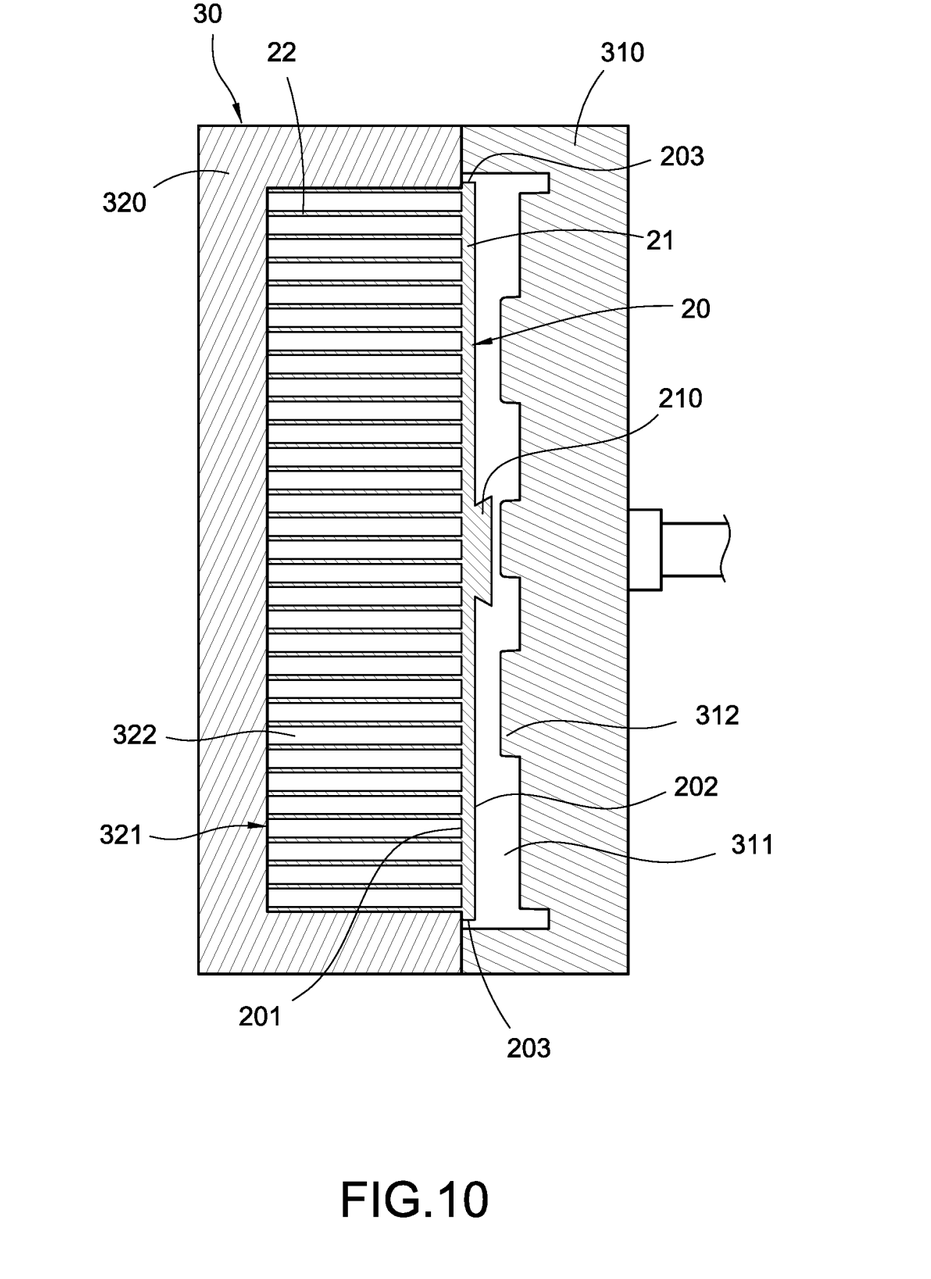
FIG. 10 is a top cross-sectional view illustrating the fin set in the mold.

Furthermore, at least one protrusion 312 is formed in the molding cave 311 corresponding to predefined at least one matching portion 13.

Figure 8:
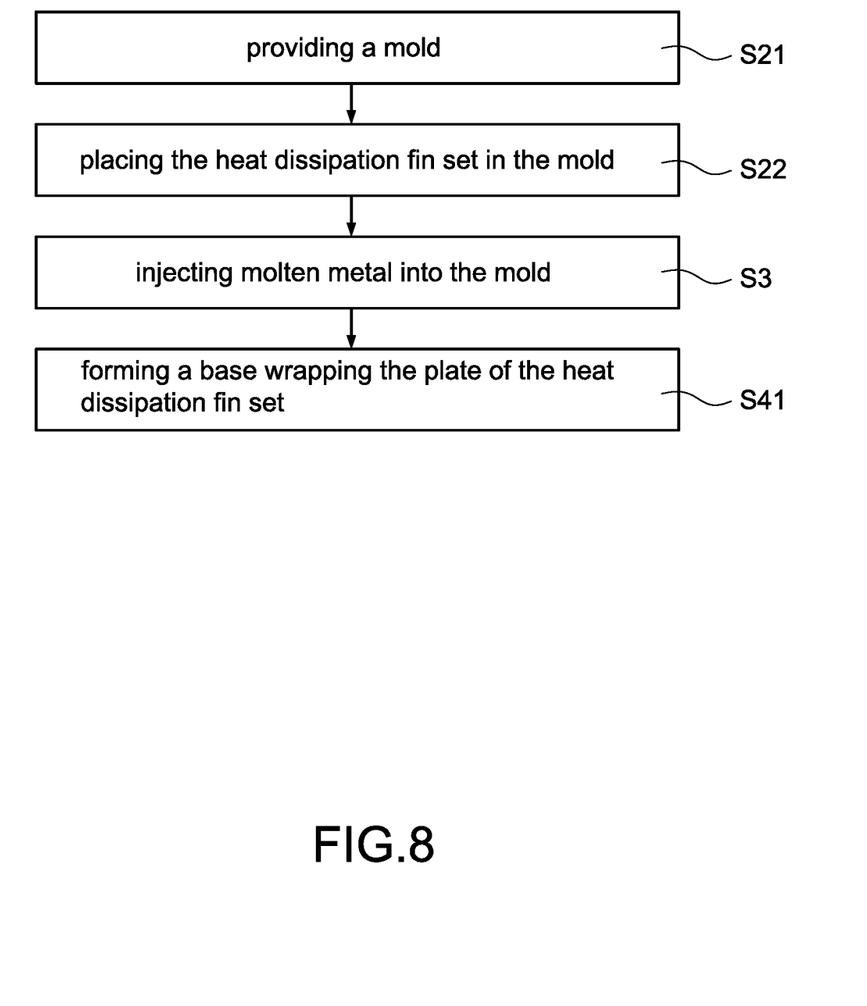
FIG. 8 is a process flow diagram illustrating a die-casting process of the present disclosure.

In step S22 according to FIGS. 8 to 10, the heat dissipation fin set 20 is placed in the mold 30. Specifically, a periphery of the external surface 201 of the plate 21 is attached with the on the fixed part 310 to seal the isolation cave 321, the heat dissipation fin set 20 and the remained portion of the external surface 201 of the plate 21 are accommodated in the isolation cave 321, and remained surfaces of the plate 21 including the internal surface 202 of the plate 21 and an peripheral edge 203 between the external surface 201 and the internal surface 202 are exposed in the molding cave 311. Furthermore, an opening of the isolation cave 321 is upright arranged, and each fin 22 of the heat dissipation fin set 20 is upright arranged in the isolation cave 321, a lower end of the fin 22 is contacted with a horizontal bottom 322 of the isolation cave 321. Thereby, the heat dissipation fin set 20 could be firmly supported on the horizontal bottom 322 of the isolation cave 321, and the heat dissipation fin set 20 could furthermore have the smallest contacting surface with the mold 30 to prevent form heat transferring from the mold 30. In contrast, if the fin 22 is horizontally disposed in the isolation cave 321, the weight of heat dissipation fin set 20 is loaded only at a root of the lowest fin 22, and the fin 22 might therefore be damaged and the plate 21 might not be sealed with the isolation cave 321.

In step S3 according to FIGS. 8 to 11, molten metal is injected into the mold 30 through the sprue 313, and the sprue 313 is then pressed to drive the molten metal to further flow into the molding cave 311 through the runner 314. Meanwhile, a pressure is caused by the injected molten metal on the internal surface 202 of the plate 21 to seal the isolation cave 321, and the isolation cave 321 is thereby isolated from the molding cave 311.

Figure 11:
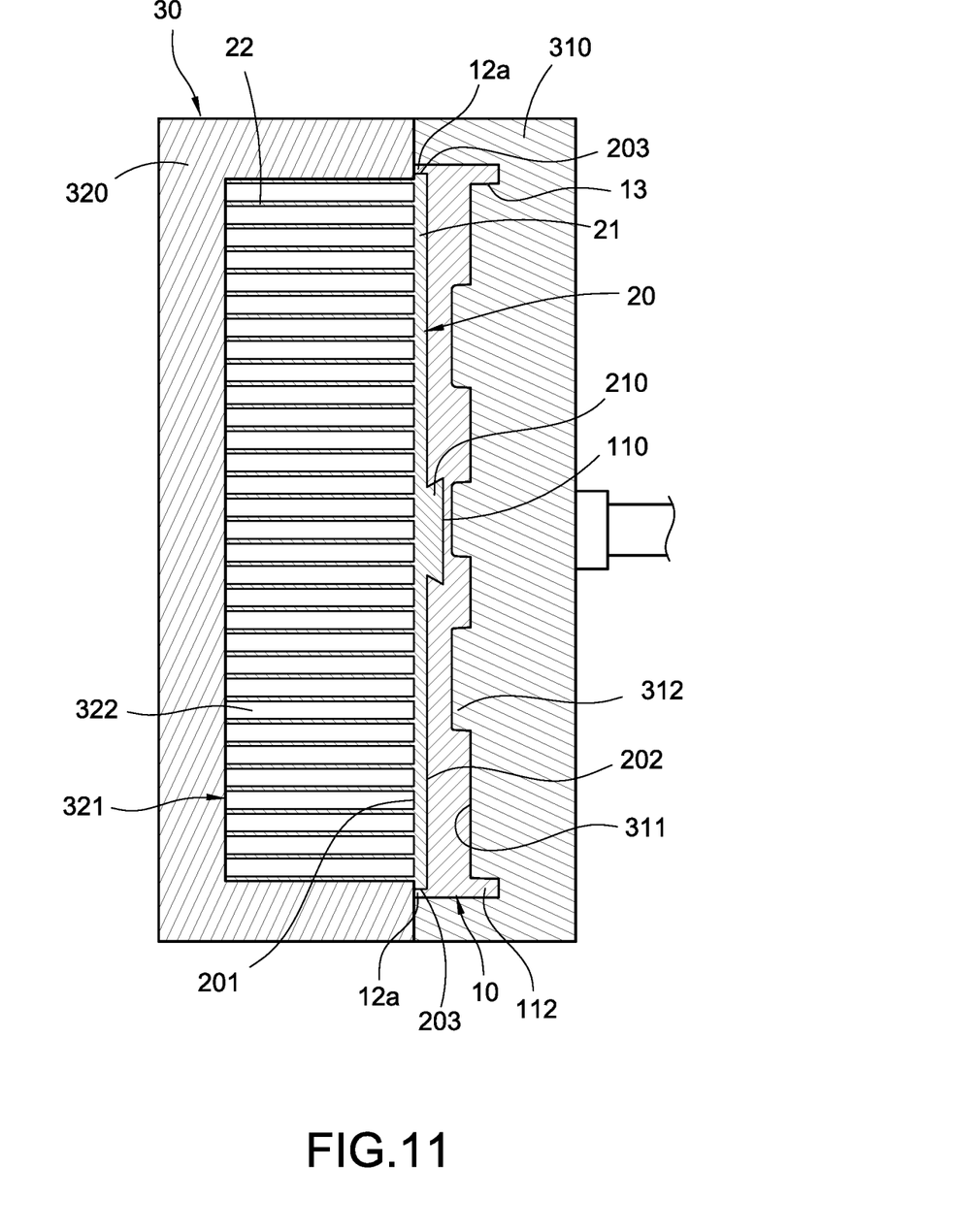
FIG. 11 is a top cross-sectional view illustrating a molding step of the die-casting process.

Thereby, the aforementioned remained surfaces of the plate 21 are covered by the molten metal, and namely the plate 21 and the joint portion 210 are surrounded by the molten metal in the molding cave 311.

Figure 12:
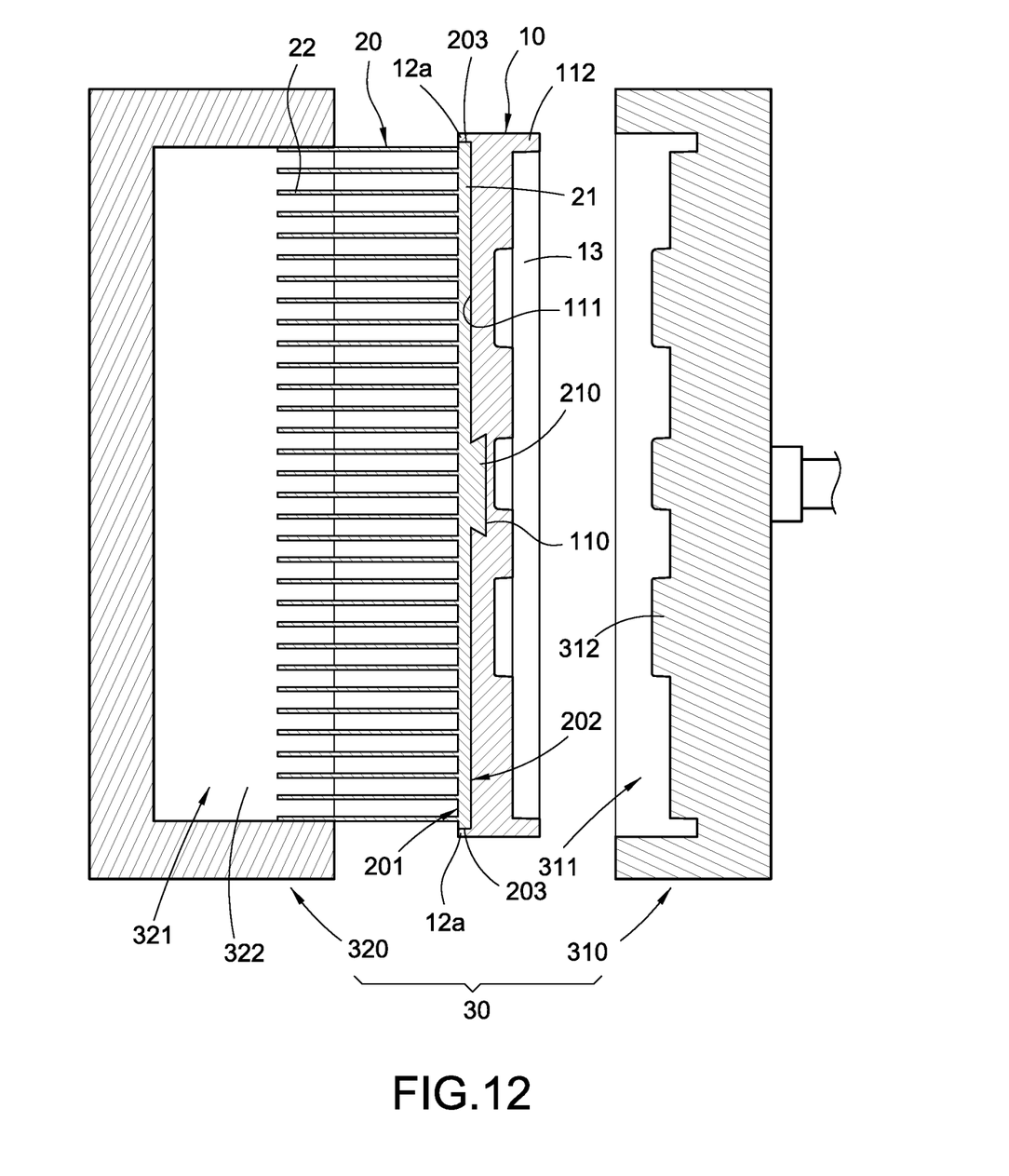
FIG. 12 is a top cross-sectional view illustrating a demolding step of the die-casting process.

The step S4 has a Step S41. In step S41 according to FIGS. 8, 11 and 12, the molten metal is cooled and solidified, the solidified metal is cut at the gate 315, and a base 10 is formed by the solidified metal to be thermal connected with the heat dissipation fin set 20. Specifically, the base 10 includes a body 11 and a surrounding block portion 12 wrapping the plate 21 of the heat dissipation fin set 20 and formed on an outer periphery of the body 11. Furthermore, the molding cave 311 encloses a heat conductive face 112 of the base 10, the heat conductive face 112 is exposed and the matching portion 13 is enclosed and formed on the heat conductive face 112 by the protrusion 312.

Furthermore, the base 10 can be shaped into a body 11 of any desired requirements. A horizontal contour of the body 11 is, for example, a rectangle, a circle, or other shapes; however, the present invention is not limited in this regard.

A conjunction face 111 is a surface where the body 11 and the heat dissipation fin set 20 are joined. A mating portion 110 of the body 11 is disposed corresponding to the joint portion 210. The conjunction face 111 and the mating portion 110 change in their profiles according to the profile of the joint portion 210. A heat conductive face 112 is at the other side of the body 11 where opposite to the conjunction face 111. The heat conductive face 112 includes at least one matching portion 13 formed and disposed corresponding to a position of a heat source or a heat generating electronic component (not illustrated), so that the base 10 can be located on an uneven surface having the heat generating electronic component.

Figure 3:
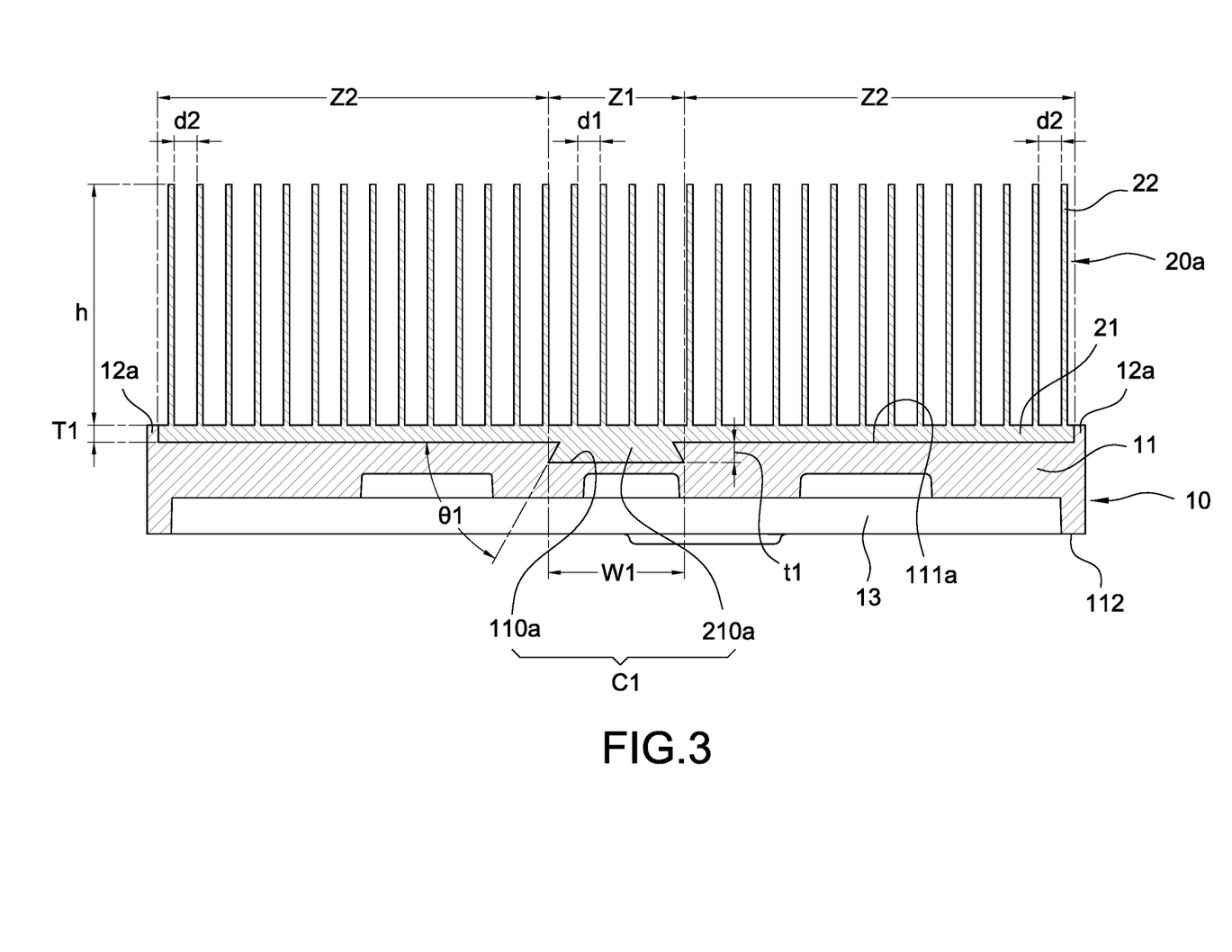
FIG. 3 is a lateral cross-sectional view of a connection structure according to one embodiment of the present invention.

The heat sink module made by the manufacturing method of the present invention has various embodiments. Please refer to FIGS. 1 to 3, showing the heat sink module according to one embodiment of the present invention. The heat sink module includes a base 10 and a heat dissipation fin set 20a connected to the base 10. Furthermore, before the heat dissipation fin set 20a is formed by an aluminum extrusion process, a connection type area Z1 and a non-connection type area Z2 are defined first, wherein the connection type area Z1 forms a joint portion 210a, and the non-connection type area Z2 does not form the joint portion 210a. The connection type area Z1 is defined in a two-dimensional manner (on a contact surface between the base 10 and the heat dissipation fin set 20), and the joint portion 210a can cover any desired portion of the contact surface and extend any desired length thereon. The embodiments of the present invention will be described in detail below.

The base 10 is formed by die-casting process as mentioned above. The base 10 includes a body 11 and a surrounding block portion 12a wrapping the heat dissipation fin set 20a and disposed on an outer periphery of the body 11. A conjunction face 111a and the above-mentioned heat conductive face 112 are at two opposite sides of the body 11. The heat conductive face 112 has the above-mentioned matching portion 13. The surrounding block portion 12a is formed around the heat dissipation fin set 20a to substantially wrap the same, and the base 10 can be made of metal selected from a group consisting of aluminum or copper.

The heat dissipation fin set 20a is connected to and thermal connected with the base 10. The heat dissipation fin set 20a includes a plate 21, a plurality of fins 22, and at least one joint portion 210a. Each of the fins 22 extends from one side of the plate 21 in a direction away from the base 10, and the fins 22 are arranged spaced from one another. The fins 22 can be flat plates extending in a straight direction; however, the present invention is not limited in this regard. A first gap d1 (see the middle of FIG. 3) is defined as a distance between neighboring two fins 22 in corresponding region. A second gap d2 (see both the left and right sides of FIG. 3) is defined as a distance between the outmost fin 22 and the adjacent fin 22. The second gap d2 is slightly larger than the first gap d1. A fin length his defined as a height of the fin 22 from a surface of the plate 21 to end of the fin 22. Relations of $10 \leq h/d1 \leq 20$ and $10 \leq h/d2 \leq 20$ are satisfied respectively.

Moreover, the joint portion 210a, formed by the aluminum extrusion process, is defined as at least one trapezoidal block gradually widening as it protrudes from a surface of the plate 21 toward the base 10. The body 11 includes a mating portion 110a corresponding to the joint portion 210a. The mating portion 110a is fitted with the trapezoidal block, and is defined as at least one trapezoidal notch formed by denting a conjunction face 111a of the body 11, and thereby the joint portion 210a and the mating portion 110a together constitute a connection structure C1 for engagement with each other, as shown in FIG. 3. Please be noted that, the one single trapezoidal block and the one single trapezoidal notch shown in the drawing are merely representative for the purpose of describing the present invention, and the present invention is not limited to any particular number of the trapezoidal blocks and the trapezoidal notches disclosed herein.

In the present embodiment, the joint portion 210a of the connection structure C1 has a connection depth t1. A connection width W1 is defined on a contact surface between the joint portion 210a and the mating portion 110a fitted with the same. The connection width W1 is at least 5 millimeters. A plate thickness T1 is defined as a thickness of the plate 21. The connection depth t1 is smaller than the plate thickness T1. The connection structure C1 has a connection angle $\theta 1$, the connection angle $\theta 1$ is from 30 to 60 degrees, and the connection angle is preferably 45 degrees to enhance the connection strength between the base 10 and the heat dissipation fin set 20a. Further, when one single trapezoidal block is taken as an example, the joint portion 210a formed on the connection type area Z1 can extend from any position at any side of the peripheral edge 203 of the plate 21 to any position at another side of the peripheral edge 203 of the plate 21. The joint portion 210a can selectively extend to the periphery of the plate 21 or not. The joint portion 210a can also extend from two sides of the peripheral edge 203 of the plate 21 to form an intersection, and the joint portion 210a can selectively extend in a straight direction or in an oblique direction.

Figure 4:
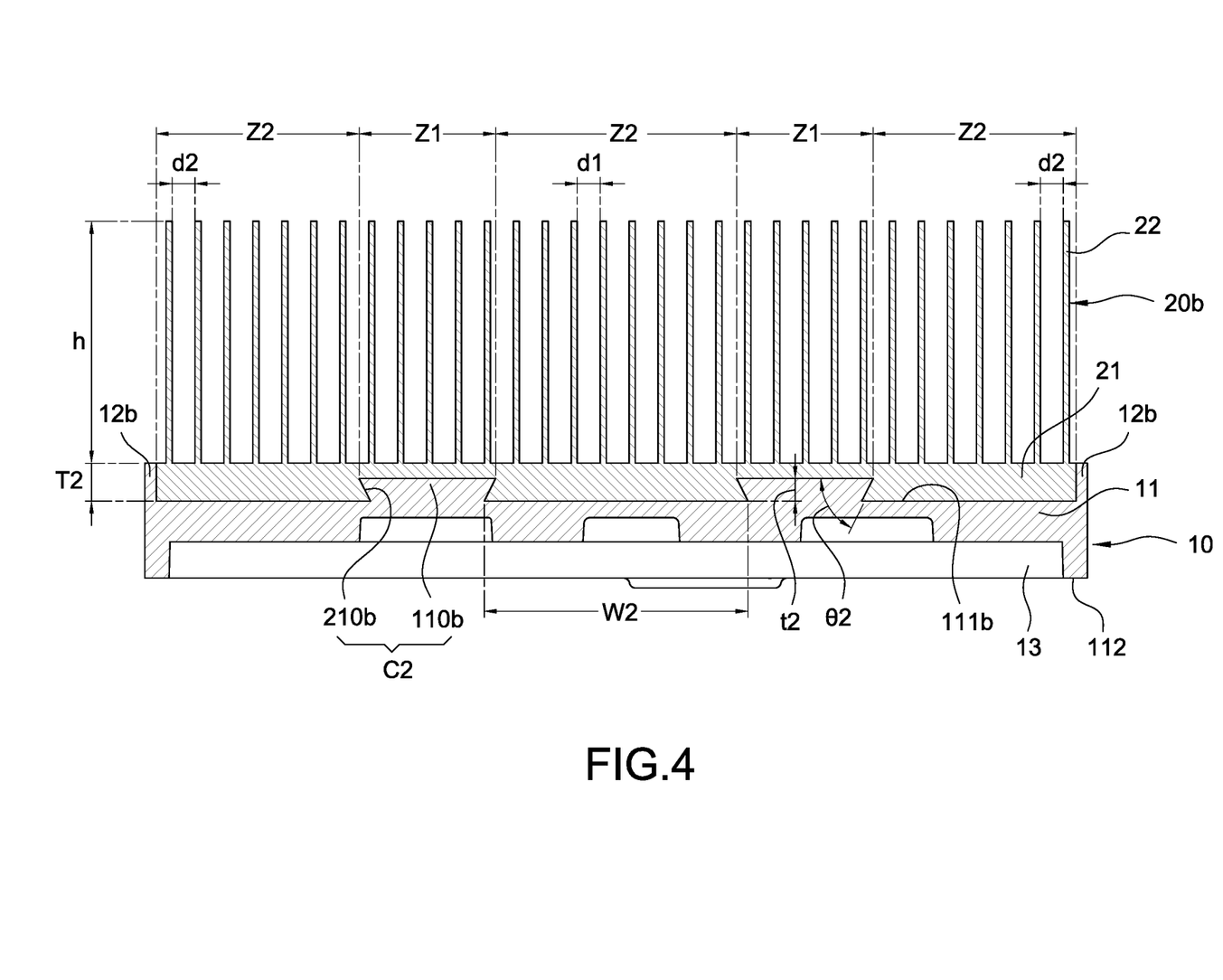
FIG. 4 is a lateral cross-sectional view of the connection structure according to another embodiment of the present invention.

Referring to FIG. 4, showing the heat sink module according to another embodiment of the present invention, the same description and a description of similar or the same components are omitted for brevity, and similar components are denoted by the same reference numerals in the foregoing embodiment. In the present embodiment, the heat sink module includes the base 10 and a heat dissipation fin set 20b connected to the base 10. Furthermore, before the heat dissipation fin set 20b is formed by the aluminum extrusion process, the connection type areas Z1 and the non-connection type areas Z2 are firstly defined. The connection type areas Z1 form the joint portions 210b, and the non-connection type areas Z2 do not form the joint portion 210b. The joint portions 210b can cover any desired portion of the contact surface and extend a desired length thereon. As shown in FIG. 4, the present embodiment includes two connection type areas Z1 and three non-connection type areas Z2 respectively.

The base 10 is formed by die-casting process. The base 10 includes the body 11 and a surrounding block portion 12b wrapping the heat dissipation fin set 20b and formed on the outer periphery of the body 11. A conjunction face 111b and the above-mentioned heat conductive face 112 are at two opposite sides of the body 11. The heat conductive face 112 has the above-mentioned matching portion 13. The surrounding block portion 12b is formed around the heat dissipation fin set 20b to substantially wrap the same.

The heat dissipation fin set 20b is connected to the base 10. The heat dissipation fin set 20b includes a plate 21, a plurality of fins 22, and at least one joint portion 210b. In particular, the present embodiment has two joint portions 210b. The joint portion 210b, formed by the aluminum extrusion process, is at least one trapezoidal notch gradually widening as it dents from a surface of the plate 21 toward the fins 22. The body 11 includes a mating portion 110b corresponding to the joint portion 210b, the mating portion 110b is at least one trapezoidal block fitted with the trapezoidal notch and protruding from the conjunction face 111b of the body 11, and thereby a connection structure C2 is formed for engagement of the mating portion 110b with the joint portion 210b. Please be noted that, although in the drawing multiple trapezoidal blocks and multiple trapezoidal notches are shown, this configuration is merely representative for the purpose of describing the present invention, and the present invention is not limited to any particular number of the trapezoidal blocks and the trapezoidal notches disclosed herein.

In the present embodiment, the joint portion 210b of the connection structure C2 has a connection depth t2. A connection width W2 is defined on the contact surface between the joint portion 210b and the mating portion 110b fitted with the same. The connection width W2 is at least 5 millimeters. A plate thickness T2 is defined as the thickness of the plate 21. The connection depth t2 is smaller than the plate thickness T2. The connection structure C2 has a connection angle θ2, the connection angle θ2 is from 30 to 60 degrees, and the connection angle is preferably 45 degrees to enhance the connection strength between the base 10 and the heat dissipation fin set 20b. Further, when multiple trapezoidal notches are taken as an example, the joint portion 210b formed on the connection type area Z1 can extend from any position at any side of the peripheral edge of the plate 21 to any position at another side of the peripheral edge of the plate 21, and the joint portion 210b can selectively extend to the periphery of the plate 21 or not. The joint portion 210b can also extend from two side of the peripheral edges of the plate 21 to form an intersection, and the joint portion 210b can selectively extend in a straight direction or in an oblique direction.

Figure 5:
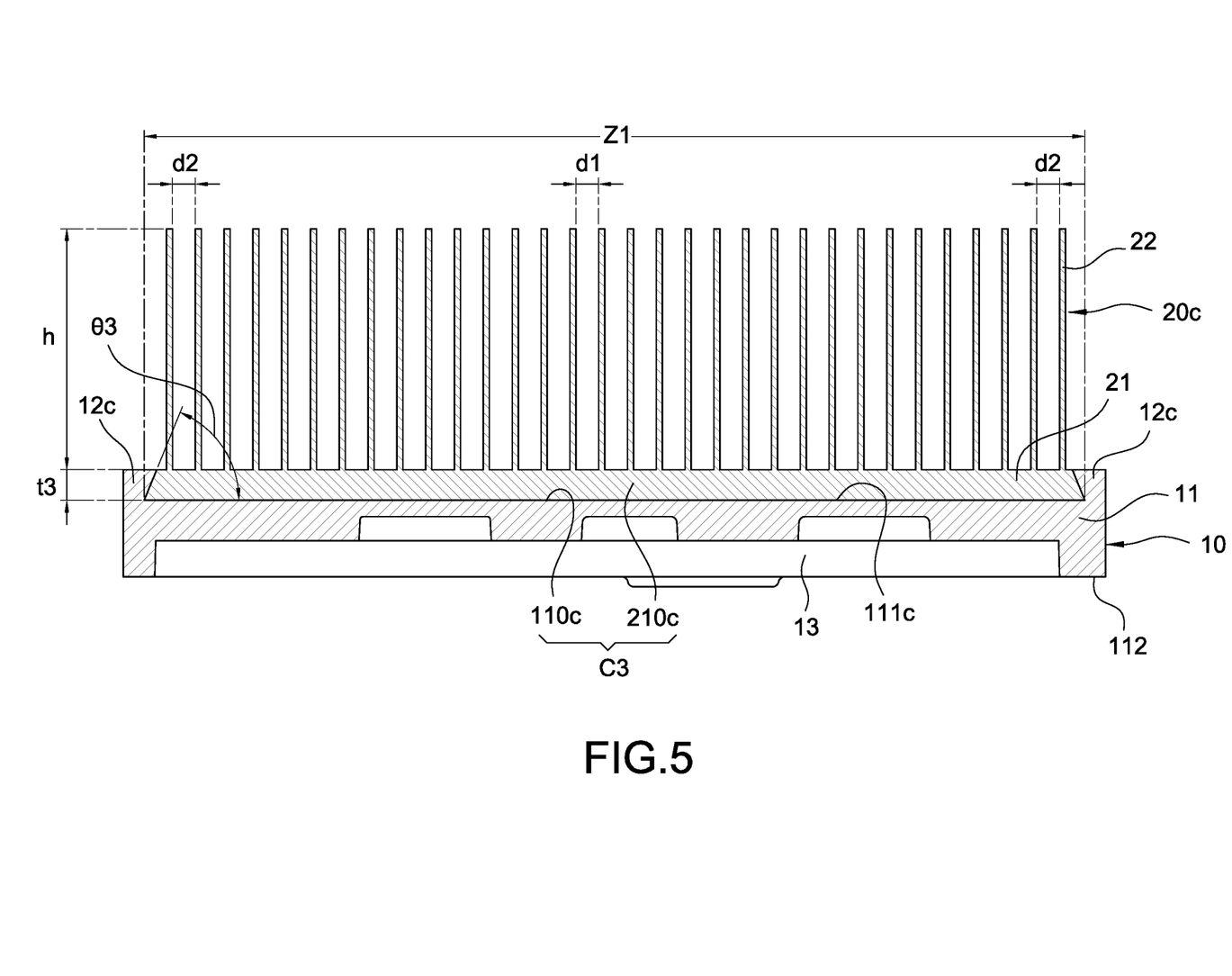
FIG. 5 is a lateral cross-sectional view of the connection structure according to still another embodiment of the present invention.

Referring to FIG. 5, showing the heat sink module according to still another embodiment of the present invention, the same description and a description of similar or the same components are omitted for brevity, and similar components are denoted by the same reference numerals in the previous two embodiments. In the present embodiment, the heat sink module includes the base 10 and a heat dissipation fin set 20c connected to the base 10. Furthermore, before the heat dissipation fin set 20c is formed by the aluminum extrusion process, the connection type area Z1 is firstly defined. The connection type area Z1 forms the joint portion 210c. The joint portion 210c can cover any desired portion of the contact surface and extend a desired length thereon. To be noted that the present embodiment does not include the non-connection type area Z2.

The base 10 is formed by die-casting process. The base 10 includes the body 11 and a surrounding block portion 12c wrapping the heat dissipation fin set 20c and formed on the outer periphery of the body 11. A conjunction face 111c and the above-mentioned heat conductive face 112 are at two opposite sides of the body 11. The heat conductive face 112 has the above-mentioned matching portion 13. The surrounding block portion 12c is formed around the heat dissipation fin set 20c to substantially wrap the same.

The heat dissipation fin set 20c is connected to the base 10. The heat dissipation fin set 20c includes a plate 21, a plurality of fins 22, and at least one joint portion 210c. The joint portion 210c, formed by the aluminum extrusion process, is a trapezoidal block gradually widening as it extends along at least one side of the peripheral edge 203 of the plate 21. In the present embodiment, the plate 21 is a block having a trapezoidal shape. The body 11 includes a mating portion 110c corresponding to the joint portion 210c. The mating portion 110c is fitted with the block having the trapezoidal shape, and is a trapezoidal notch formed by denting a conjunction face 111c of the body 11, and thereby a connection structure C3 is formed for engagement of the joint portion 210c with the mating portion 110c. In the present embodiment, the joint portion 210c of the connection structure C3 has a connection depth t3. The connection depth t3 is defined as the thickness of the plate 21. The connection structure C3 has a connection angle θ3, the connection angle θ3 is from 30 to 60 degrees, and the connection angle is preferably 45 degrees to enhance the connection strength between the base 10 and the heat dissipation fin set 20c.

Figure 6:
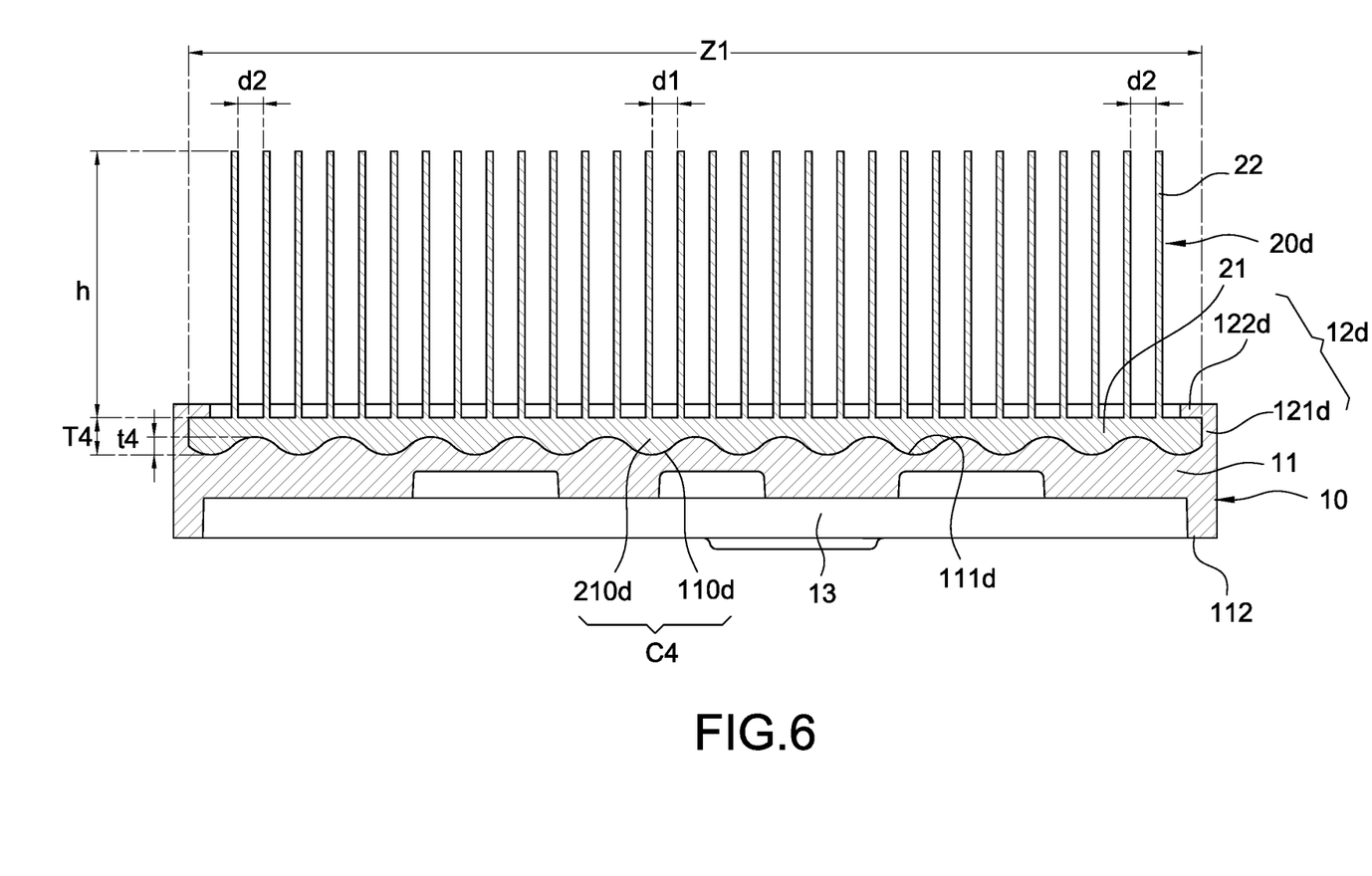
FIG. 6 is a lateral cross-sectional view of the connection structure according to yet another embodiment of the present invention.

Referring to FIG. 6, showing the heat sink module according to yet another embodiment of the present invention, the same description and a description of similar or the same components are omitted for brevity, and similar components are denoted by the same reference numerals in the previous three embodiments. In the present embodiment, the heat sink module includes the base 10 and a heat dissipation fin set 20d connected to the base 10. Furthermore, before the heat dissipation fin set 20d is formed by the aluminum extrusion process, the connection type area Z1 is firstly defined. The connection type area Z1 forms the joint portion 210d. The joint portion 210d can cover any desired portion of the contact surface and extend a desired length thereon. To be noted that the present embodiment does not include the non-connection type area Z2.

The base 10 is formed by die-casting process. The base 10 includes the body 11 and a surrounding block portion 12d wrapping the heat dissipation fin set 20d and formed on the outer periphery of the body 11. A conjunction face 111d and the above-mentioned heat conductive face 112 are at two opposite sides of the body 11. The heat conductive face 112 has the above-mentioned matching portion 13. The surrounding block portion 12d is formed around the heat dissipation fin set 20d and includes a block wall 121d and a covering portion 122d bent from the block wall 121d.

The heat dissipation fin set 20d is connected to the base 10. The heat dissipation fin set 20d includes a plate 21, a plurality of fins 22, and at least one joint portion 210d. The joint portion 210d, formed by the aluminum extrusion process, is a continuous wave-shaped block extending from any side of the peripheral edge of the plate 21. The body 11 includes a mating portion 110d corresponding to the joint portion 210d, the mating portion 110d is a wave-shaped notch fitted with the wave-shaped block and formed by inwardly denting the conjunction face 111c of the body 11. The covering portion 122d of the surrounding block portion 12d covers and extends from one side surface of the plate 21 having the fins 22. The joint portion 210d, the mating portion 110d and the surrounding block portion 12d together constitute a connection structure C4. In the present embodiment, the joint portion 210d of the connection structure C4 has a connection depth t4. The connection depth t4 is defined as a vertical distance from a top of the wave to a bottom of the wave. A plate thickness T4 is defined as the thickness of the plate 21. The connection depth t4 is smaller than the plate thickness T4, so as to enhance the connection strength between the base 10 and the heat sink fin set 20d.

In the heat sink modules constituted by the base 10 and the heat dissipation fin sets 20a, 20b, 20c, 20d according to each of the above-mentioned embodiments of the present invention, there are similarities as follows. Multiple fins having an aspect ratio of 10 or above are formed on the plate 21 by the aluminum extrusion process at one time or one process; the joint portions 210a, 210b, 210c, 210d are formed at the other side of the plate 21; molten metal is injected to form by die-casting the base 10 having a mating portion 110 corresponding to the plate 21 and the joint portion 210, so as to enhance the connection strength between the heat dissipation fin set 20 and the base 10; for each of the fins 22 in any of the above embodiments, a ratio of the fin length h to the first gap d1 and a ratio of the fin length h to the second gap d2 are from 10 to 20, wherein the ratio is defined as the aforesaid aspect ratio. Moreover, compared to conventional techniques, more heat dissipation fins are disposed in the same area to thereby increase a heat dissipation area, and it is not necessary to design a draft angle as the conventional techniques do.

Besides, the heat dissipation fin set is formed at one time or one process, thus saving considerable time in forming fins respectively by separate aluminum extrusion processes, and eliminating the possibility of having burrs caused by the overflow of the molten metal when the base is formed by die-casting process. In addition, if it is desired to further improve the heat conductive efficiency, the heat dissipation fin set 20 and the base 10 can be made of different metal materials.

In summary, the heat sink module and the manufacturing method thereof certainly can achieve anticipated objectives and solve the conventional defects. The present invention also has novelty and non-obviousness, so the present invention completely complies with the requirements of patentability. Therefore, a request to patent the present invention is filed pursuant to patent law. Examination is kindly requested, and allowance of the present application is solicited to protect the rights of the inventor.

What is claimed is:

1. A method of manufacturing heat sink module, comprising steps of:

forming a heat dissipation fin set by an aluminum extrusion process, wherein the heat dissipation fin set comprises a plate, a plurality of fins extending from one side of the plate and being arranged spaced from one another, and a joint portion formed on the other side of the plate;

placing the heat dissipation fin set in a mold having a sealed isolation cave to seal the isolation cave by the heat dissipation fin set, and the fins are accommodated in the isolation cave; and injecting molten metal into the mold to form a base thermal connected with the heat dissipation fin set, wherein the base includes a body and a surrounding block portion wrapping a peripheral edge of the plate.

2. The method of claim 1, wherein the molten metal consists of aluminum or copper.

3. The method of claim 1, wherein the mold encloses an isolation cave and a molding cave communicated with each other are enclosed.

4. The method of claim 3, wherein the isolation cave is isolated with the molding cave by the plate, and the peripheral edge of the plate and a surface of the plate opposite to the fins are exposed in the molding cave.

5. The method of claim 4, wherein each fin of the heat dissipation fin set is upright arranged in the isolation cave, a lower end of the fin is contacted with a horizontal bottom of the isolation cave.

6. The method of claim 4, wherein at least one protrusion is formed in the molding cave to enclose at least one matching portion on the body of the heat dissipation fin set.

* * * * *